United States Patent [19]

Colles

[11] Patent Number: 4,831,282
[45] Date of Patent: May 16, 1989

[54] CMOS INPUT CIRCUIT

[75] Inventor: Joseph H. Colles, Oceanside, Calif.

[73] Assignee: Brooktree Corporation, San Diego, Calif.

[21] Appl. No.: 104,690

[22] Filed: Oct. 5, 1987

Related U.S. Application Data

[62] Division of Ser. No. 714,503, Mar. 21, 1985, abandoned.

[51] Int. Cl.[4] .................. H03K 17/16; H03K 19/017; H03K 17/687
[52] U.S. Cl. .................................. 307/443; 307/448; 307/451; 307/572; 307/576
[58] Field of Search ................ 307/443, 448, 451–452, 307/571–572, 576

[56] References Cited

U.S. PATENT DOCUMENTS 4,430,580 2/1984 Lovelace ............................ 307/355

OTHER PUBLICATIONS

IBM Tech. Disc. Bul., Bansal, vol. 25, No. 7A, 12/82.
IBM Tech. Dis. Bul., Craig, vol. 17, No. 12, 5/75.

Primary Examiner—Stanley D. Miller
Assistant Examiner—M. R. Wambach
Attorney, Agent, or Firm—Ellsworth R. Roston; Charles H. Schwartz

[57] ABSTRACT

A digital value represented by first and second pluralities of signals is converted into an analog value represented by an analog signal. The converter and the associated circuitry described above are preferably disposed on an integrated circuit chip formed from MOS transistors. Circuitry provides output currents of optimal waveforms from the digital-to-analog converters for driving stages subsequent to such converters. The circuits of this invention are advantageous because they operate satisfactorily at frequencies in excess of eighty-five megahertz (85 mhz). The circuits facilitate the production of the signals at such high frequencies by employing the distributed capacitances in a first transistor to expedite the response of a second transistor to binary input signals introduced to the first transistor. A servo system is also provided for controlling the magnitude of a biasing voltage introduced to the second transistor and for maintaining substantially constant the currents flowing at all times through one or the other of the first and second transistors.

19 Claims, 2 Drawing Sheets

CMOS INPUT CIRCUIT

This is a continuation, of application Ser. No. 714,503, filed Mar. 21, 1985 now abandoned.

This invention relates to systems for converting between digital and analog values. The system is particularly advantageous because it is constructed to operate on a monotonic basis in a simple and straightforward manner to provide accurate indications of analog values. The system is also advantageous because it is able to operate at high speeds to provide such analog indications.

Various types of equipment receive information in analog form. Such equipment includes process control equipment, measuring instruments, communication equipment and a wide variety of other equipments. Digital computers and data processing systems often receive input parameters in analog form from such equipment and convert these analog parameters to digital form for processing in the computer on the data processing equipment. After the analog information has been converted to digital information and has been processed, the output information from the digital computer or the data processing equipment is often converted to analog form. By converting the digital information to analog form, the user can assimilate the information in ways which would be difficult if the information remained in digital form.

As digital computers and data processing equipment have become widespread throughout industry and have even become common in the home, the need for inexpensive, simple and reliable apparatus for converting information between digital and analog forms has become of increasing concern. A considerable effort has been devoted over a period of several decades to provide for converting apparatus which is simple, inexpensive and reliable. In spite of such efforts, the converting apparatus now in use does not meet such criteria.

The converters now in use also have other longstanding problems. For example, the converters now in use may not be monotonic unless they are quite expensive and complex. By "monotonic" is meant that digital information of progressively increasing value is converted to analog information of progressively increasing value without any decrease in the analog value as the digital value progressively increases. The converting apparatus now in use also has relatively high differential and integral non-linearities unless the apparatus is quite expensive and complex. Integral nonlinearities result from errors produced in a conversion between analog and digital values over a wide range of such values. Differential nonlinearities result from errors produced in a conversion between analog and digital values over a relatively narrow range of such values.

The converters now in general use also have a problem of major proportions. This results when particular digital values are increased incrementally by a single digit. For example, problems in the converters now in use result when a binary representation of "511" is converted into a binary representation of "512". This results from the fact that the binary representation of "511" is represented by a value of "0111111111" and a binary representation of "512" is represented by "1000000000" where the least significant digit is at the right. As will be seen, the value of each binary digit changes when the decimal value changes from "511" to "512". As the binary values change from "0111111111" to "1000000000", discontinuities may occur because there is a change between a binary value of "0" and a binary value of "1" at each digital position. These discontinuities may prevent the converters from being truly monotonic. This problem even exists in converters which are made quite complex in an attempt to overcome the problem.

The problems discussed in the previous paragraph have been aggravated by the increased speeds at which the computers and data processing equipment, and their associated converters, have been operated. For example, computers and data processing systems now operate at speeds of 100 megahertz and even higher. For example, at such frequencies, the converters have increased difficulties of operating on a monotonic basis with minimal integral and differential non-linearities.

This invention provides a digital-to-analog converter which overcomes the disadvantages of the prior art. The converter operates at high frequencies such as frequencies in the order of approximately one hundred (100) megahertz (100 mhz) and provides a monotonic output, with minimum integral and differential errors, even while operating at such high frequencies.

The apparatus of this invention converts a digital value represented by first and second pluralities of digital signals into an analog value represented by the magnitude of an analog signal.

The converter and associated circuitry described above are preferably disposed on an integrated circuit chip which includes MOS transistors. Circuitry is also provided on the integrated circuit chip for converting the binary "1" and "0" signals from the digital-to-analog converter into signals with sharp characteristics and with optimal waveforms for driving stages subsequent to such converter. Such circuits are also advantageous because the signals produced by the circuitry of this invention retain such sharp characteristics at frequencies in excess of eighty-five megahertz (85 mhz). Such circuitry facilitates the production of the signals at such high frequencies by employing the distributed capacitances in a first transistor to expedite the response of a second transistor to binary input signals introduced to the first transistor.

A servo system is also provided for controlling the magnitude of a biasing voltage introduced to the second transistor and for maintaining substantially constant the current flowing at all times through one or the other of the first and second transistors.

Figure 1:
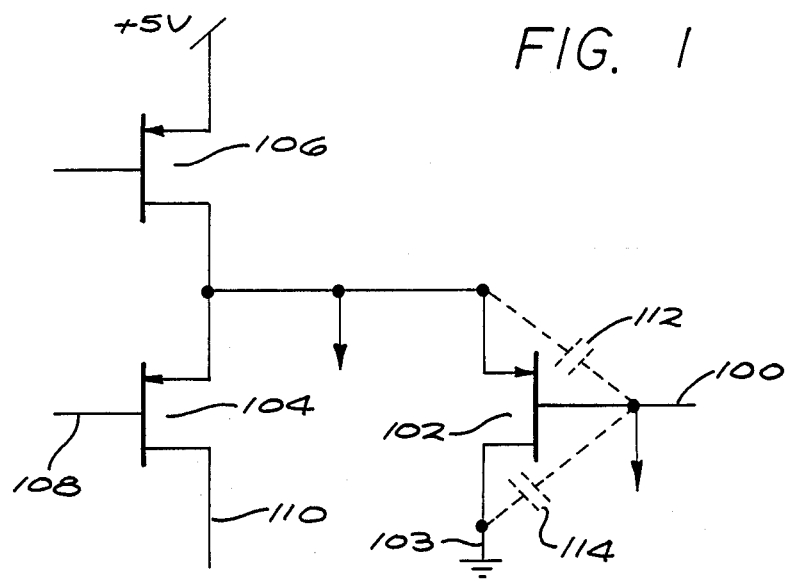
FIG. 1 is a diagram of circuitry for receiving binary input signals and for producing output currents representative of such binary input signals.

FIG. 1 illustrates circuitry for receiving binary input signals and for producing an output current representative of the binary input signals. The circuitry of FIG. 1 is particularly adapted to be used in a digital-to-analog converter. The circuitry shown in FIG. 1 includes an input line 100 for receiving the binary input signals. The input line 100 is connected to the gate of a transistor 102 such as a MOS transistor of the p-type. The drain of the transistor 102 is connected through a line 103 to a reference potential such as ground. The source of the transistor 102 is common with the source of a transistor 104 and with the drain of a transistor 106. The transistors 104 and 106 may be MOS transistors of the p-type.

Figure 3:
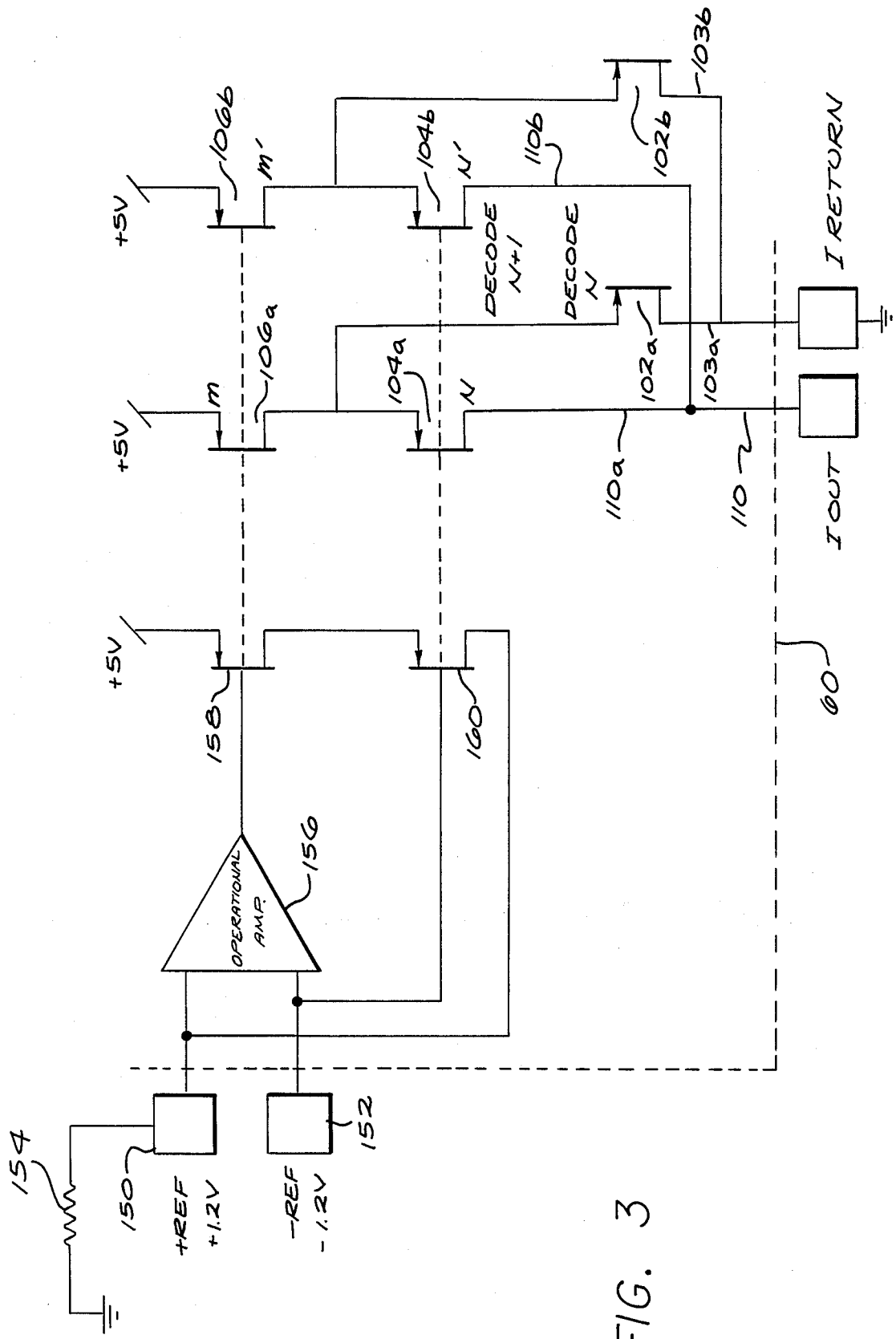
FIG. 3 is a schematic electrical diagram of a servo system which may be used in conjunction with the circuitry shown in FIG. 1.
Figure 3:
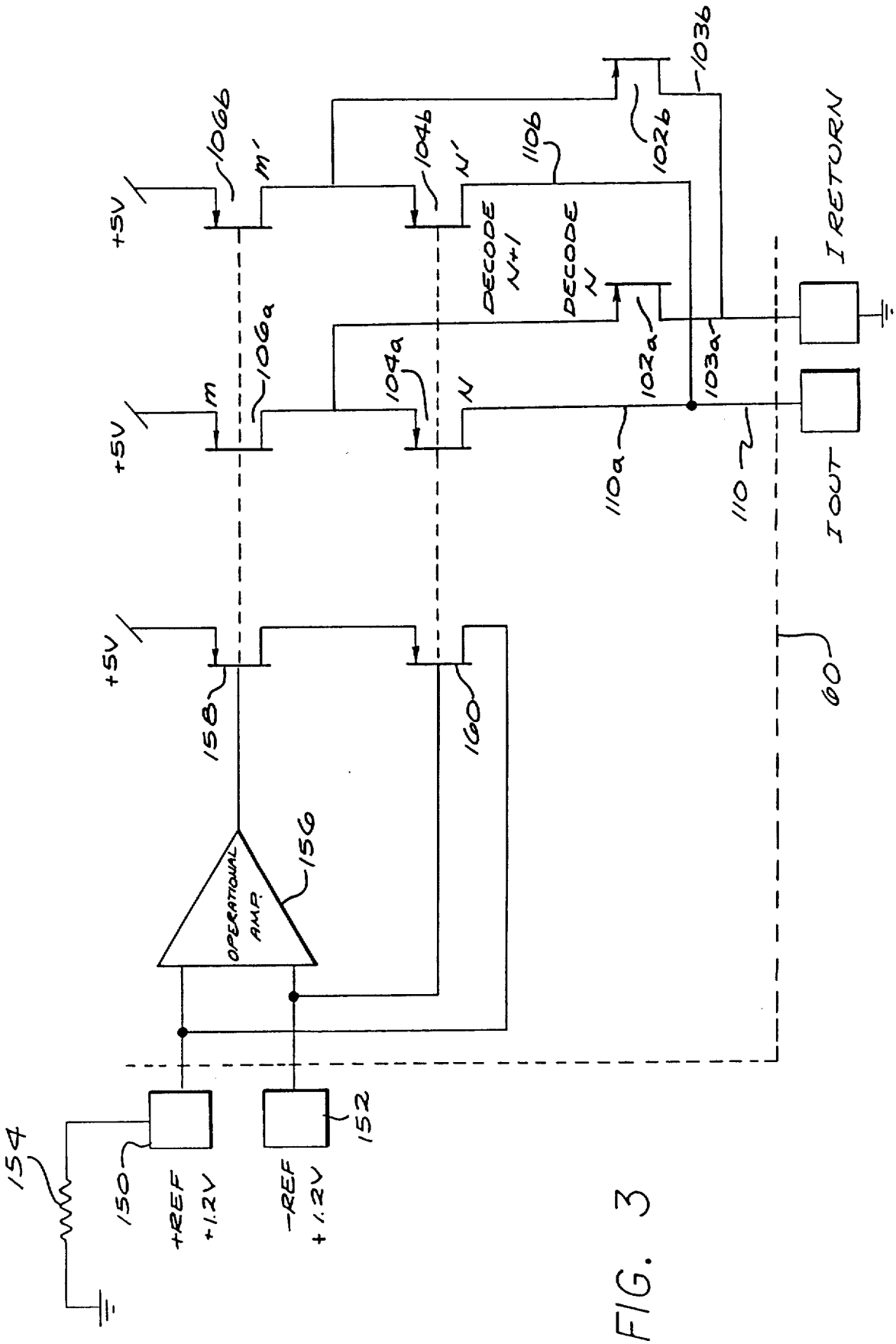

The source of the transistor 106 receives an energizing potential such as approximately 5 volts. The gate of the transistor 106 receives a substantially constant bias voltage through a circuit which is shown in FIG. 3 and which will be described in detail subsequently. The gate of the transistor 104 receives a suitable biasing voltage such as a voltage of approximately 1.2 volts on a line 108. The output from the circuitry shown in FIG. 1 is produced on a line 110 which is connected to the drain of the transistor 104.

Distributed capacitances 112 (shown in broken lines in FIG. 1) exist between the gate and the source of the transistor 102 and distributed capacitances 114 (shown in broken lines in FIG. 1) exist between the gate and the drain of the transistor. These distributed capacitances are charged during the time that the transistor 102 is nonconductive and they become discharged when the transistor 102 becomes conductive.

In output circuitry of the prior art, the discharge of a distributed capacitance corresponding to the capacitance 112 occurs through a circuit including the source and gate of a transistor and the discharge of a distributed capacitor corresponding to the capacitance 114 occurs through a circuit including the gate and drain of the transistor. However, in the prior art, such a transistor is an n-type rather than being the p-type shown for the transistor 102 in FIG. 1. As a result of the charge and discharge of such distributed capacitances, a current signal on the line 110 in FIG. 1 is produced in the n-type of transistor in the prior art with characteristics such as indicated at 116 in FIG. 2. This signal has a blip 118 which is produced upon a change from a non-conductive state to a conductive state in the operation of the n-type of transistor of the prior art. Similarly, the n-type of transistor corresponding in the prior art to the transistor 102 (p-type in this invention) produces a slow edge 119 when the state of the transistor changes from a conductive to a non-conductive state. This results from the fact that the drain of the transistor in the prior art (corresponding to the transistor 106) must swing over a larger voltage range than this invention requires. The parasitic capacitances corresponding to the capacitances 112 and 114 and the large voltage swings interfere with the operation of the output circuitry in the prior art and they slow the response of such circuitry.

Figure 2:
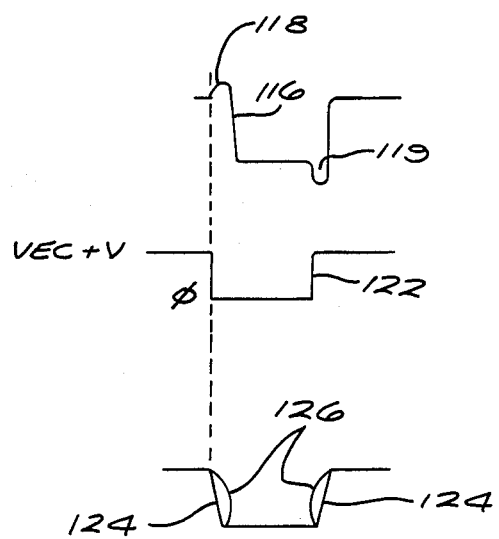
FIG. 2 illustrates waveforms of voltages and currents produced by the circuitry shown in FIG. 1.

A signal 122 in FIG. 2 may be introduced to the line 100 (FIG. 1). This causes the transistor 102 to become conductive. The production of a conductive state in the transistor 102 is also facilitated because it is in series with the transistor 106. The current through the transistor 106, and therefore through the transistor 102, has a predetermined value because of the fixed bias introduced to the base of the transistor 106 through the circuitry shown in FIG. 3. When the transistor 102 becomes conductive, the charges in its parasitic capacitances 112 and 114 facilitate the flow of current through the transistor 102. The distributed capacitances 112 and 114 accordingly aid the switching of the output transistor 104 from the conductive state to the non-conductive state, thus increasing the switching speed of the transistor 104. Furthermore, the voltage swing at the drain of the transistor 106 is reduced and this further increases the speed of switching the transistor 104. This results in the current wave forms 124 (FIG. 2) in the line 110 in FIG. 1.

At the end of the signal on the line 100, the transistor 102 becomes non-conductive and the transistor 104 becomes conductive because of the bias voltage on the gate of the transistor 104. The resultant flow of current through the transistors 106 and 104 produces a rise in voltage on the drain of the transistor 106 and on the source of the transistor 104. Since this rise in voltage is from a value of approximately +1 volts which is produced on the sources of the transistors 102 and 104 when the transistor 102 is conductive, the rise in voltage on the drain of the transistor 104 is quite fast. This results in part from the fact that the voltage of approximately +1 volts on the source of the transistor 104 is quite close to the voltage of approximately +1.2 volts on the gate of the transistor. This is particularly true since the corresponding voltage on the source of the n-type of transistor in the prior art to the transistor corresponding 102 (p-type in this invention) is approximately 0 volts. The production of a positive voltage on the source of the transistor 104 is facilitated by the charging of the distributed capacitances 112 and 114 when the transistor 102 becomes non-conductive.

As a result of the discharge of the distributed capacitances 112 and 114 through the transistor 102 in the circuitry shown in FIG. 1 when the transistor 102 becomes conductive, the slope of the signal produced if the distributed capacitors 112 and 114 did not discharge through the transistor 102. This may be seen from a comparison of the leading edge of the signal 124 (FIG. 2) produced on the line 110 by the circuitry shown in FIG. 1 in comparison to the leading edge of a signal 126 produced on the same line by the circuitry of the prior art. Furthermore, as will be seen from the signal 124, no blips are produced in the leading and trailing edges of the signal.

The trailing edge of the output signal 124 produced by the circuitry shown in FIG. 1 is also sharper than the signal 126 produced by the circuitry of the prior art. This results from the reduced time, in comparison to the prior art, for the voltage on the drain of the transistor 104 to reach the proper value when the transistor 104 changes from a non-conductive state to a conductive state in the circuitry of this invention.

As will be seen from the above discussion, the circuitry shown in FIG. 1 and described above has certain advantages over the prior art. It provides on the output line 110 the signal 124 at a frequency in excess of eighty-five megahertz (85 mhz). It also provides the signal 124 with relatively sharp characteristics. This is in contrast to the prior art since the prior art provides the output signal 126 at a maximum frequency of approximately twenty-five megahertz (25 mhz) and with characteristics not nearly as sharp as those of the signal 124.

FIG. 3 illustrates circuitry for regulating the biasing voltages introduced to the gates of the transistors 104 and 106. The circuitry shown in FIG. 3 is disposed on an integrated circuitry chip. The circuitry shown in FIG. 3 includes a pad 150 outside of the chip 60 for providing a reference voltage such as approximately 1.2 volts and a pad 152 outside of the chip 60 for providing a reference voltage such as approximately −1.2 volts. A resistance 154 is disposed electrically between the pad 150 and a reference potential such as ground.

Input terminals of an operational amplifier 156 are respectively connected to the pads 150 and 152. The output from the operational amplifier 156 is introduced to the gate of a transistor 158 such as a MOS transistor of the p-type. The source of the transistor 158 receives an energizing voltage such as approximately +5 volts. The drain of the transistor 158 and a source of a transistor 160 are common. Connections are respectively made from the gate and the drain of the transistor 160 to the pads 152 and 150. The transistor 160 may be a MOS transistor of the p-type.

The output of the operational amplifier 156 is introduced to the gates of transistors 106a, 106b, etc. corresponding to the transistor 106 in FIG. 1. Similarly, connections are made from the pad 152 to the gates of transistors 104a, 104b, etc. corresponding to the transistor 104 in FIG. 1. Transistors 102a, 102b, etc. (corresponding to the transistor 102 in FIG. 10) are respectively connected to the transistors 104a and 106a and to the transistors 104b and 104b in a manner shown in FIG. 1. Lines 110a, 110b, etc. are connected to the line 110 also shown in FIG. 1. Lines 103a, 103b, etc. correspond to the line 103 in FIG. 1.

A substantially constant current flows through a circuit including the pad 150, the resistance 154 and the reference potential such as ground. This current is balanced in the operational amplifier 156 by the current produced in the amplifier as the result of the introduction of the voltage from the pad 152 to the amplifier. The current in the operational amplifier biases the transistor 158 to a state of conductivity so that current flows through the transistors 158 and 160 to the pad 150 to correct for any imbalances between the current flowing through the operational amplifier 156 and the current flowing through the resistance 154. In this way, the bias introduced from the operational amplifier 156 to the gate of the transistor 158 is substantially constant.

The transistors 158 and 160 correspond respectively to the transistors 106a, 106b, etc., and the transistors 104a, 104b, etc. As a result, the same current flows through the transistors 106a and 104a and through the transistors 106b and 104b as flows through the transistors 158 and 160. As a result, each of the circuits 106a and 104a, 106b and 104b, etc., provides a substantially constant current to the output line 110 in FIGS. 1 and 3 when a signal is introduced to the gate of the associated one of the transistors 102a, 102b, etc., to make these transistors conductive. The magnitude of the cumulative current on the output line 110 indicates the analog value corresponding to the value of digital signals introduced to the gates of the transistors 102a, 102b, etc. in FIG. 3. The analog indication represented by the current on the line 110 is monotonic and provides minimal integral and differential non-linearities.

Although this invention has been disclosed and illustrated with reference to particular embodiments, the principles involved are susceptible for use in numerous other embodiments which will be apparent to persons skilled in the art. The invention is, therefore, to be limited only as indicated by the scope of the appended claims.

I claim:

1. In combination for providing an output current having characteristics indicating a binary voltage having first characteristics representing a binary "1" and second characteristics representing a binary "0",
   a first MOS transistor
   means for introducing a substantially constant reference voltage to the first transistor,
   means for introducing the binary input voltage to the first MOS transistor to obtain a conductivity of the first MOS transistor for a particular one of the first and second characteristics and to obtain a non-conductivity of the first MOS transistor for the other one of the first and second characteristics,
   means including a second MOS transistor connected to the first transistor and constructed to become non-conductive upon a state of conductivity in the first MOS transistor,
   means for introducing a substantially constant bias voltage to the second MOS transistor,
   means operatively coupled to the first and second MOS transistors and responsive to the substantially constant bias introduced to the second transistor for providing for a substantially constant flow of current through the second MOS transistor, and no flow of current through the second MOS transistor, and no flow of current through the first transistor, during the state of conductivity in the second transistor and for providing for the flow of the substantially constant current through the first MOS transistor, and no flow of current through the second transistors, during the state of conductivity in the first MOS transistor to obtain the output current from the second transistor in representation of the binary input signal,
   there being distributed capacitances in the first MOS transistor, the distributed capacitances being charged during the state of non-conductivity in the first transistor, the first and second transistors being connected to provide for the control in the operation of the second transistor in accordance with the state of operation in the first transistor and the charge in the distributed capacitances, and
   the transition from the state of non-conductivity to the state of conductivity in the second MOS transistor being expedited by the charging of the distributed capacitances when the first transistor becomes non-conductive, and
   means connected to the second transistor to provide the output current through the second transistor.

2. A combination as set forth in claim 1, including,
   the distributed capacitances being operative to obtain a potential from the first transistor upon a state of non-conductivity in the first MOS transistor for expediting the production of the substantially constant current through the second MOS transistor when the first transistor becomes non-conductive and the distributed capacitances being operative to discharge through the first transistor when the first transistor becomes conductive so as to expedite the time for the first transistor to become conductive and the second transistor to become non-conductive.

3. A combination as set forth in claim 2, including,
   the means for providing the substantially constant flow of current through the first and second MOS transistors during the respective conductivities of the first and second MOS transistors including a third MOS transistor and further including means for introducing a substantially constant bias voltage to the third MOS transistor to provide for the flow of the substantially constant current through the third MOS transistor.

4. A combination as set forth in claim 3 wherein:
   the first, second and third MOS transistors constitute p-type transistors.

5. A combination as set forth in claim 1 wherein the change in the operation of the second MOS transistor from a state of conductivity to a state of non-conductivity is expedited by the discharge of the distributed capacitances when the first MOS transistor becomes conductive and wherein the first and second MOS transistors are p-type transistors.

6. A system as set forth in claim 3, consisting of servo means operatively coupled to the second and third transistors and operative in a closed loop to maintain the substantially constant current through the third transistor.

7. A combination as set forth in claim 3, including, servo means including fourth and fifth transistors operatively coupled respectively to the second and third transistors for providing a closed loop path for regulating the flow of current through the fourth and fifth transistors to maintain the substantially constant current through the third transistor, the first, second, third, fourth and fifth transistors being of the p-type, the change in the operation of the second transistor from a state of non-conductivity to a state of conductivity being expedited by the charging of the distributed capacitances in the first transducer when the first transistor becomes non-conductive.

8. A system for providing an output current having characteristics indicating a binary input voltage having first characteristics representing a binary "1" and second characteristics representing a binary "0", consisting of a first MOS transistor having first, second and third terminals, means for introducing the binary input voltage to the first terminal of the first MOS transistor, second and third MOS transistors connected in a series relationship, each of the second and third MOS transistors having first, second and third terminals, means for introducing a substantially constant voltage to the first terminal of the third MOS transistor to bias the third MOS transistor to a state of conductivity, means for introducing a substantially constant bias voltage to the first terminal of the second MOS transistor to provide for the flow of a substantially constant current continuously through the second MOS transistor, means for providing an activating voltage only of a single polarity, means for introducing the activating voltage to the third terminal of the second MOS transistor, means for providing a substantially constant reference potential to the second terminal of the first MOS transistor, means for commonly connecting the second terminal of the second MOS transistor, the third terminal of the first MOS transistor and the third terminal of the third MOS transistor to obtain the flow of the substantially constant current from the second MOS transistor through only one of the first and third MOS transistors dependent upon the characteristics of the voltage applied to the first terminal of the first MOS transistor, and means for producing the output current at the second terminal of the third MOS transistor in accordance with the state of conductivity in the third MOS transistor, the first MOS transistor having distributed capacitances between the first and second terminals and the first and third terminals to expedite the response of the third MOS transistor to the binary input signal, each of the first, second and third transistors being of the same type.

9. A system as set forth in claim 8 wherein the reference potential applied to the second terminal of the first MOS transistor is ground and any voltage blips at the common connection between the second terminal of the second transistor, the third terminal of the first transistor and the third terminal of the third transistor are minimized by the distributed capacitances in the first transistor.

10. A system as set forth in claim 9 wherein the first, second and third MOS transistors are p-type transistors.

11. A system as set forth in claim 8, consisting of a first additional transistor having first, second and third elements, a second additional transistor having first, second and third elements, means for providing the activating voltage to the third element of the first additional transistor, means for providing a biasing potential to the first element of the first additional transistor to obtain continually the flow of the substantially constant current through the first additional transistor, the second element of the first additional transistor and the third element of the second additional transistor having a common connection, means for providing a feedback from the second element of the second additional transistor to the biasing means for the first element of the first additional transistor to maintain the current through the first additional transistor substantially constant, the first element of the first additional transistor being connected to the first element of the second transistor, and the first element of the second additional transistor being connected to the first element of the third transistor.

12. A combination as set forth in claim 11 wherein the first, second and third transistors are p-type transistors and the first and second additional transistors are p-type transistors.

13. A system for producing an output current representative of a binary input voltage having first characteristics representative of a binary "1" and second characteristics representative of a binary "0", consisting of a first MOS transistor of the p-type, the first MOS transistor having states of conductivity and non-conductivity, the first MOS transistor having a source, a gate and a drain, there being distributed capacitances between the source and the gate of the first MOS transistor and between the gate and the drain of the first MOS transistor to facilitate the flow of current through the first MOS transistor when the first MOS transistor becomes conductive.

means for introducing a substantially constant reference voltage to the drain of the first transistor, means for introducing the binary input voltage to the gate of the first MOS to obtain states of conductivity and non-conductivity in the first C-MOS transistor in accordance with the logic level of such binary input voltage, a second MOS transistor of the p-type, the second MOS transistor having a source, drain and a gate, the sources of the first and second transistors being connected to each other, means for continuously introducing a substantially constant current to the sources of the first and second MOS transistors, means for introducing a substantially constant biasing voltage to the gate of the second MOS transistor, and means for producing the output current at the drain of the second MOS transistor in accordance with the logic levels of the signals introduced to the gate of the first MOS transistor.

14. A system as set forth in claim 13, consisting of the constant current means including a third MOS transistor biased to produce the flow of the substantially constant current continually through the third MOS transistor, any voltage blips at the sources of the first and second transistors being minimized by the distributed capacitances in the first transistor.

15. A system as set forth in claim 13, consisting of a third MOS transistor having a source, a gate and a drain, means for providing an activating voltage only of a single polarity, means for introducing the activating voltage to the source of the third MOS transistor, the drain of the third MOS transistor being connected to the sources of the first and second MOS transistors, and means for introducing a substantially constant biasing voltage to the gate of the third MOS transistor to produce a substantially constant flow of current continuously through the third MOS transistor.

16. A system as set forth in claim 15, consisting of the third MOS transistor being of the p-type, any voltage blips on the sources of the first and second transistors and the drain of the third transistor being minimized by the distributed capacitances in the first transistor.

17. In a combination as set forth in claim 16, the distributed capacitances in the first MOS transistor being operative to decrease the time for the second MOS transistor to become conductive when the first MOS transistor becomes non-conductive.

18. A system as set forth in claim 17 consisting of a first additional transistor having a source, a gate and a drain and constituting a p-type, a second additional transistor having a source, a gate and a drain and constituting a p-type, the gate of the first additional transistor being connected to the gate of the third transistor, the gate of the second additional transistor being connected to the gate of the second transistor, the drain of the first additional transistor being connected to the source of the second additional transistor, means for introducing an energizing voltage to the source of the first additional transistor, means for introducing a biasing potential to the gate of the first additional transistor to produce a flow of current through such transistor, and means for feeding the voltage on the drain of the second additional transistor back to the biasing means for maintaining the flow of current through the first additional transistor substantially constant.

19. A combination as set forth in claim 13, including, the means for introducing the substantially constant flow of current to the sources of the first and second transistors including servo means for regulating the substantially constant flow of current.

* * * * *

UNITED STATES PATENT AND TRADEMARK OFFICE
CERTIFICATE OF CORRECTION

PATENT NO. : 4,831,282
DATED : MAY 16, 1989
INVENTOR(S) : JOSEPH H. COLLES

It is certified that error appears in the above-identified patent and that said Letters Patent is hereby corrected as shown below:

Column 4, line 61, change "-1.2" to --+1.2--.

Column 6, lines 14-16, cancel "and no flow of current through the second MOS transistor,";

line 20, make "transistors" singular.

Figure 3 of the drawings, the voltage on the pad 152, which is -1.2 volts, should be changed to +1.2 volts as shown on the attached sheet.

Signed and Sealed this

Fourth Day of September, 1990

Attest:

HARRY F. MANBECK, JR.

*Attesting Officer*      *Commissioner of Patents and Trademarks*

REEXAMINATION CERTIFICATE (1789th)
United States Patent [19]
Colles

[11] B1 4,831,282
[45] Certificate Issued Sep. 15, 1992

[54] CMOS INPUT CIRCUIT

[75] Inventor: Joseph H. Colles, Oceanside, Calif.

[73] Assignee: Brooktree Corporation

Reexamination Request:
No. 90/002,243, Jan. 4, 1991

Reexamination Certificate for:
Patent No.: 4,831,282
Issued: May 16, 1989
Appl. No.: 104,690
Filed: Oct. 5, 1987

[51] Int. Cl.$^5$ .................. H03K 17/16; H03K 19/017; H03K 17/687
[52] U.S. Cl. .................... 307/443; 307/448; 307/451; 307/572; 307/576
[58] Field of Search ................ 307/443, 448, 451–452, 307/572, 576

[56] References Cited

U.S. PATENT DOCUMENTS

4,393,370 6/1983 Hareyama .......................... 340/347
4,405,916 9/1983 Hornak et al. ...................... 340/347

FOREIGN PATENT DOCUMENTS

56-115027 9/1981 Japan .

OTHER PUBLICATIONS

Telmos Publication: "TML 1840 Video DAC"; Mar. 1984, published by Telmos Inc.
I. C. Converter Design Insights; Chapter 9 of "a book published by Analog Devices Corp. Prior to 1985"; pp. 277–296.
Grebene, Data Conversion Circuits: Digital-To-Analog Converters; Publ. by Wiley & Sons, 1984; pp. 780–784.
Converter Micro Circuits; from a book published by Analog Devices Corp. Prior to 1985; pp. 236–240.
Kelly, et al., A Single-Chip CMOS PCM Codec; IEEE Journal of Solid-State Circuits, vol. SC-14, No., 1, Feb. 1979; pp. 54–59.

*Primary Examiner*—John S. Heyman

[57] ABSTRACT

A digital value represented by first and second pluralities of signals is converted into an analog value represented by an analog signal. The converter and the associated circuitry described above are preferably disposed on an integrated circuit chip formed from MOS transistors. Circuitry provides output currents of optimal waveforms from the digital-to-analog converters for driving stages subsequent to such converters. The circuits of this invention are advantageous because they operate satisfactorily at frequencies in excess of eighty-five megahertz (85 mhz). The circuits facilitate the production of the signals at such high frequencies by employing the distributed capacitances in a first transistor to expedite the response of a second transistor to binary input signals introduced to the first transistor. A servo system is also provided for controlling the magnitude of a biasing voltage introduced to the second transistor and for maintaining substantially constant the currents flowing at all times through one or the other of the first and second transistors.

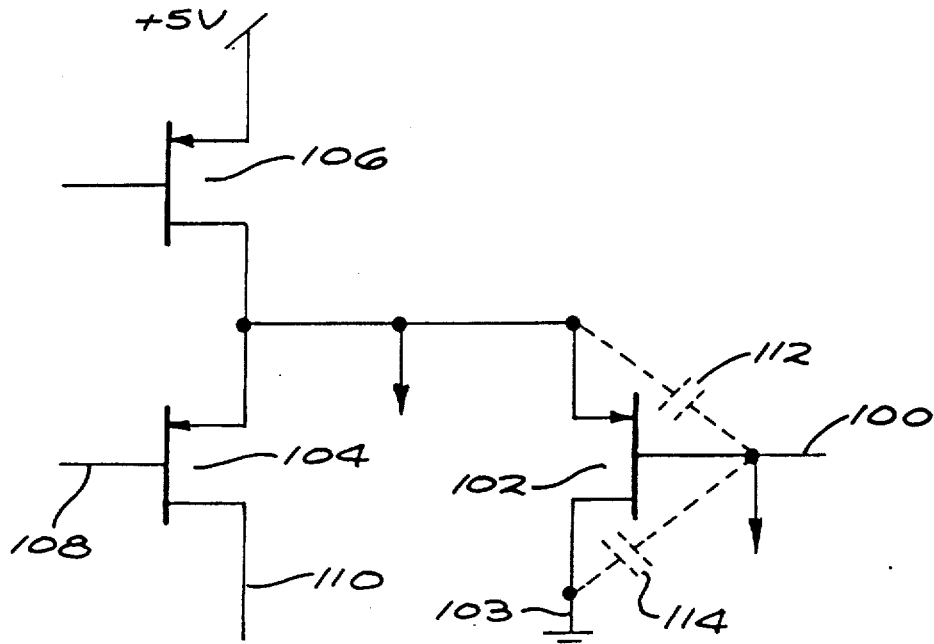

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

Claims 1, 2, 6–9, 11–14, 16, 18 and 19 are determined to be patentable as amended.

Claims 3–5, 10, 15 and 17 dependent on an amended claim, are determined to be patentable.

New claims 20–30 are added and determined to be patentable.

1. In combination for providing an output current having characteristics indicating a binary *input* voltage having first characteristics representing a binary "1" and second characteristics representing a binary "0",
   a first MOS transistor,
   means for introducing a substantially constant reference voltage to the first transistor,
   means for introducing the binary input voltage to the first MOS transistor to obtain a conductivity of the first MOS transistor for a particular one of the first and second characteristics and to obtain a non-conductivity of the first MOS transistor for the other one of the first and second characteristics,
   means including a second MOS transistor connected to the first *MOS* transistor and constructed to become non-conductive upon a state of conductivity in the first MOS transistor,
   means for introducing a substantially constant bias voltage to the second MOS transistor,
   means operatively coupled to the first and second MOS transistors and responsive to the substantially constant bias *voltage* introduced to the second *MOS* transistor for providing for a substantially constant flow of current through the second MOS transistor, second MOS transistor, and no flow of current through the first *MOS* transistor, during the state of conductivity in the second *MOS* transistor and for providing for the flow of the substantially constant current through the first MOS transistor and no flow of current through the second [transistors] *transistor*, during the state of conductivity in the first MOS transistor to obtain the output current from the second *MOS* transistor in representation of the binary input signal,
   there being distributed capacitances in the first MOS transistor, the distributed capacitances being charged during the state of non-conductivity in the first *MOS* transistor, the *first and second MOS* transistors being connected to provide for the control in the operation of the second *MOS* transistor in accordance with the state of operation in the first *MOS* transistor and the charge in the distributed capacitances, and
   the transition from the state of non-conductivity to the state of conductivity in the second MOS transistor being expedited by the charging of the distributed capacitances when the first *MOS* transistor becomes non-conductive, and
   means connected to the second *MOS* transistor to provide the output current through the second *MOS* transistor.

2. A combination as set forth in claim 1, including,
   the distributed capacitances being operative to obtain a potential from the first *MOS* transistor upon a state of non-conductivity in the first MOS transistor for expediting the production of the substantially constant current through the second MOS transistor when the first *MOS* transistor becomes non-conductive and the distributed capacitances being operative to [discharge] *charge* through the first *MOS* transistor when the first *MOS* transistor becomes conductive so as to expedite the time for the [first transistor to become conductive and the] second transistor to become non-conductive.

6. A system as set forth in claim 3, consisting of
   servo means operatively coupled to the second and third *MOS* transistors and operative in a closed loop to maintain the substantially constant current through the third *MOS* transistor.

7. A combination as set forth in claim 3, including,
   servo means including fourth and fifth *MOS* transistors operatively coupled respectively to the second and third *MOS* transistors for providing a closed loop path for regulating the flow of current through the fourth and fifth *MOS* transistors to maintain the substantially constant current through the third *MOS* transistor,
   the first, second, third, fourth and fifth *MOS* transistors being of the p-type,
   the change in the operation of the second transistor from a state of non-conductivity to a state of conductivity being expedited by the charging of the distributed capacitances in the first [transducer] *MOS transistor* when the first transistor becomes non-conductive.

8. A system for providing an output current having characteristics indicating a binary input voltage having first characteristics representing a binary "1" and second characteristics representing a binary "0", consisting of
   a first MOS transistor having first, second and third terminals,
   means for introducing the binary input voltage to the first terminal of the first MOS transistor,
   second and third MOS transistors connected in a series relationship, each of the second and third MOS transistors having first, second and third terminals,
   means for introducing a substantially constant voltage to the first terminal of the third MOS transistor to bias the third MOS transistor to a state of conductivity,
   means for introducing a substantially constant bias voltage to the first terminal of the second MOS transistor to provide for the flow of a substantially constant current continuously through the second MOS transistor,
   means for providing an activating voltage only of a single polarity,
   means for introducing the activating voltage to the third terminal of the second MOS transistor, means for providing a substantially constant reference potential to the second terminal of the first MOS transistor, means for commonly connecting the second terminal of the second MOS transistor, the third terminal of the first MOS transistor and the third terminal of the third MOS transistor to obtain the flow of the substantially constant current from the second MOS transistor through only one of the first and third MOS transistors dependent upon the characteristics of the voltage applied to the first terminal of the first MOS transistor, and means for producing the output current at the second terminal of the third MOS transistor in accordance with the state of conductivity in the third MOS transistor, the first MOS transistor having distributed capacitances between the first and second terminals and the first and third terminals to expedite the response of thethird MOS transistor to the binary input signal, each of the first, second and third *MOS* transistors being of the same type.

9. A system as set forth in claim 8 wherein the reference potential applied to the second terminal of the first MOS transistor is ground and any voltage blips at the common connection between the second terminal of the second *MOS* transistor, the third terminal of the first *MOS* transistor and the third terminal of the third *MOS* transistor are minimized by the distributed capacitances in the first *MOS* transistor.

11. [A system as set forth in claim 8, consisting of]
*A system for providing an output current having characteristics indicating a binary input voltage having first characteristics representing a binary "1" and second characteristics representing a binary "0", consisting of*

*a first MOS transistor having first, second and third terminals,*

*means for introducing the binary input voltage to the first terminal of the first MOS transistor,*

*second and third MOS transistors connected in a series relationship, each of the second and third MOS transistors having first, second and third terminals,*

*means for introducing a substantially constant voltage to the first terminal of the third MOS transistor to bias the third MOS transistor to a state of conductivity,*

*means for introducing a substantially constant bias voltage to the first terminal of the second MOS transistor to provide for the flow of a substantially constant current continuously through the second MOS transistor,*

*means for providing an activating voltage only of a single polarity,*

*means for introducing the activating voltage to the third terminal of the second MOS transistor,*

*means for providing a substantially constant reference potential to the second terminal of the first MOS transistor,*

*means for commonly connecting the second terminal of the second MOS transistor, the third terminal of the first MOS transistor and the third terminal of the third MOS transistor to obtain the flow of the substantially constant current from the second MOS transistor through only one of the first and third MOS transistors dependent upon the characteristics of the binary input voltage applied to the first terminal of the first MOS transistor,*

*means for producing the output current at the second terminal of the third MOS transistor in accordance with the state of conductivity in the third MOS transistor,*

*the first MOS transistor having distributed capacitances between the first and second terminals and the first and third terminals to expedite the response of the third MOS transistor to the binary input voltage,*

*each of the first, second and third MOS transistors being of the same type,*

*the reference potential applied to the second terminal of the first MOS transistor being ground and any voltage blips at the common connection between the second terminal of the second MOS transistor, the third terminal of the first MOS transistor and the third terminal of the third MOS transistor being minimized by the distributed capacitances in the first MOS transistor,* a first additional *MOS* transistor having first, second and third [elements] *terminals,* a second additional *MOS* transistor having first, second and third [elements] *terminals,* means for providing the activating voltage to the third [element]ep *terminal* of the first additional *MOS* transistor,

[means for providing a biasing potential to the first element of the first additional transistor to obtain continually the flow of the substantially constant current through the first additional transistor,]

the second [element] *terminal* of the first additional *MOS* transistor and the third [element] *terminal* of the second additional *MOS* transistor having a common connection, means for providing a feedback from the second [element] *terminal* of the second additional *MOS* transistor to the [biasing means for the first element of the first additional transistor] *means for introducing a substantially constant bias voltage* to maintain the current through the first additional *MOS* transistor substantially constant, the first [element] *terminal* of the first additional *MOS* transistor being connected to the first [element] *terminal* of the second *MOS* transistor, and the first [element] *terminal* of the second additional *MOS* transistor being connected to the first [element] *terminal* of the third *MOS* transistor.

12. A combination as set forth in claim 11 wherein the first, second and third *MOS* transistors are p-type transistors and the first and second additional *MOS* transistors are p-type transistors.

13. A system for producing an output current representative of a binary input voltage having first characteristics representative of a binary "1" and second characteristics representative of a binary "0", consisting of a first MOS transistor of the p-type, the first MOS transistor having states of conductivity and nonconductivity, the first MOS transistor having a source, a gate and a drain, there being distributed capacitances between the source and the gate of the first MOS transistor and between the gate and the drain of the first MOS transistor to facilitate the flow of current through the [first] *second* MOS transistor when the [first] *second* MOS transistor becomes conductive, means for introducing a substantially constant reference voltage to the drain of the first *MOS* transistor, means for introducing the binary input voltage to the gate of the first MOS *transistor* to obtain states of conductivity and non-conductivity in the first [C-MOS] *MOS* transistor in accordance with the logic level of such binary input voltage, a second MOS transistor of the p-type, the second MOS transistor having a source, drain and a gate, the sources of the first and second *MOS* transistors being connected to each other, means for continuously introducing a substantially constant current to the source of the first and second MOS transistors, means for introducing a substantially constant biasing voltage to the gate of the second MOS transistor, and means for producing the output current at the drain of the second MOS transistor in accordance with the logic levels of the signals introduced to the gate of the first MOS transistor.

14. A system as set forth in claim 13, consisting of the constant current means including a third MOS transistor biased to produce the flow of the substantially constant current continually through the third MOS transistor, any voltage blips at the sources of the first and second *MOS* transistors being minimized by the distributed capacitances in the first *MOS* transistor.

16. A system as set forth in claim 15, consisting of the third MOS transistor being of the p-type, any voltage blips on the sources of the first and second *MOS* transistors and the drain of the third *MOS* transistor being minimized by the distributed capacitances in the first *MOS* transistor.

18. [A system as set forth in claim 17 consisting of] *A system for producing an output current representative of a binary input voltage having first characteristics representative of a binary "1" and second characteristics representative of a binary "0", consisting of*

*a first MOS transistor of the p-type, the first MOS transistor having states of conductivity and non-conductivity, the first MOS transistor having a source, a gate and a drain, there being distributed capacitances between the source and the gate of the first MOS transistor and between the gate and the drain of the first MOS transistor to facilitate the flow of current through the first MOS transistor when the first MOS transistor becomes conductive,*

*means for introducing a substantially constant reference voltage to the drain of the first MOS transistor,*

*means for introducing the binary input voltage to the gate of the first MOS transistor to obtain states of conductivity and non-conductivity in the first C-MOS transistor in accordance with the logic level of such binary input voltage,*

*a second MOS transistor of the p-type, the second MOS transistor having a source, drain and a gate,*

*the sources of the first and second MOS transistors being connected to each other,*

*means comprising a third MOS transistor having a source, a drain and a gate for continuously introducing a substantially constant current to the sources of the first and second MOS transistors,*

*means for introducing a substantially constant biasing voltage to the gate of the second MOS transistor,*

*means for producing the output current at the drain of the second MOS transistor in accordance with the logic levels of the binary input voltage introduced to the gate of the first MOS transistor,*

*means for providing an activating voltage only of a single polarity,*

*means for introducing the activating voltage to the source of the third MOS transistor,*

*the drain of the third MOS transistor being connected to the sources of the first and second MOS transistors,*

*means for introducing a substantially constant biasing voltage to the gate of the third MOS transistor to produce a substantially constant flow of current continuously through the third MOS transistor,*

*the third MOS transistor being of the p-type,*

*any voltage blips on the sources of the first and second MOS transistors and the drain of the third MOS transistor being minimized by the distributed capacitances in the first MOS transistor,*

*the distributed capacitances in the first MOS transistor being operative to decrease the time for the second MOS transistor to become conductive when the first MOS transistor becomes non-conductive,* a first additional *MOS* transistor having a source, a gate and a drain and constituting a p-type, a second additional *MOS* transistor having a source, a gate and a drain and constituting a p-type, the gate of the first additional *MOS* transistor being connected to the gate of the third *MOS* transistor, the gate of the second additional *MOS* transistor being connected to the gate of the second *MOS* transistor, the drain of the first additional *MOS* transistor being connected to the source of the second additional *MOS* transistor, means for introducing an energizing voltage to the source of the first additional *MOS* transistor, *and* means for introducing a biasing potential to the gates of the first additional transistor to produce a flow of current through such transistor, and means for feeding the voltage on the drain of the second additional *MOS* transistor back to the [biasing means] *means for introducing a substantially constant biasing voltage* for maintaining the flow of current thrugh the first additional *MOS* transistor and the second additional *MOS* transistor substantially constant.

19. A combination as set forth in claim 13, including, means for introducing the substantially constant flow of current to the sources of the first and second *MOS* transistors including servo means for regulating the substantially constant flow of current.

20. In combination for providing an output current having characteristics indicating a binary input voltage having first characteristics representing a binary "1" and second characteristics representing a binary "0", a first MOS trnsistor, means for introducing a substantially constant reference voltage to the first MOS transistor, means for introducing the binary input voltage to the first MOS transistor to obtain a conductivity of the first MOS transistor for a particular one of the first and second characteristics in the binary input voltage and to obtain a non-conductivity of the first MOS transistor for the other one of the first and second characteristics in the binary input voltage, means including a second MOS transistor connected to the first MOS transistor and constructed to become non-conductive upon a state of conductivity in the first MOS transistor, means for introducing a substantially constant bias voltage to the second MOS transistor, means operatively coupled to the first and second MOS transistors and responsive to the substantially constant bias voltage introduced to the second MOS transistor for providing for a substantially constant flow of current through the second MOS transistor, and no flow of current through the first MOS transistor, during the state of conductivity in the second MOS transistor and for providing for the flow of the substantially constant current through the first MOS transistor, and no flow of current through the second MOS transistor, during the state of conductivity in the first MOS transistor to obtain the output current from the second MOS transistor in representation of the binary input voltage, there being distributed capacitances in the first MOS transistor, the distributed capacitances being charged during the state of a non-conductivity in the first MOS transistor, the first and second MOS transistors being connected to provide for the control in the operation of the second MOS transistor in accordance with the state of operation in the first MOS transistor and the charge in the distributed capacitances in the first MOS transistor, the transition from the state of non-conductivity to the state of conductivity in the second MOS transistor being expedited by the charging of the distributed capacitances when the first MOS transistor becomes non-conductive, means connected to the second MOS transistor to provide the output current through the second MOS transistor, additional ones of the first MOS transistors, additional ones of the second MOS transistors, means for introducing the substantially constant reference voltage to each of the first additional MOS transistors, there being a plurality of binary input voltages each having first characteristics representing a binary "1" and second characteristics representing a binary "0", means for introducing each of the binary input voltages in the plurality to an individual one of the first additional MOS transistors to obtain a conductivity of such individual one of the first additional MOS transistors for the particular one of the first and second characteristics in such binary input voltage and to obtain a non-conductivity of such individual one of the first additional MOS transistors for the other one of the first and second characteristics in such binary input voltage, means including each of the second additional MOS transistors and connected to an individual one of the first additional MOS transistors and constructed to become non-conductive upon a state of conductivity in such individual one of the first additional MOS transistors, means for introducing the substantially constant bias voltage to each of the second additional MOS transistors, means operatively coupled to each of the second additional MOS transistors and the individual one of the first additional MOS transistors and responsive to the substantially constant bias voltage for providing for a substantially constant flow of current through such second additional MOS transistor, and no flow of current through such individual one of the first additional MOS transistors, during the state of conductivity in such second additional MOS transistor and for providing for the flow of the substantially constant current through such individual one of the first additional MOS transistors, and no flow of current through such second additional MOS transistor, during the state of conductivity in such individual one of the first additional MOS transistors to obtain the output current from such second additional MOS transistor in representation of the binary input voltage introduced to such individual one of the first additional MOS transistors, there being distributed capacitances in each of the first additional MOS transistors, the distributed capacitances in each of the first additional MOS transistors being charged during the state of non-conductivity in such first additional MOS transistor, each of the second additional MOS transistors and the individual one of the first additional MOS transistors being connected to provide for the control in the operation of such second additional MOS transistor in accordance with the state of operation in such individual one of the first additional MOS transistors and the charge in the distributed capacitances in such individual one of the first additional MOS transistors, the transition from the state of non-conductivity to the state of conductivity in each of the second additional MOS transistors being expedited by the charging of the distributed capacitances in the individual one of the first additional MOS transistors when such individual one of the first additional MOS transistors becomes non-conductive, and the means connected to the second MOS transistor to provide an output current constituting an output line, such output line also being connected directly to each of the second additional MOS transistors to provide in such output line an output current constituting an accumulation of the current through the second MOS transistor and the second additional MOS transistors.

21. In combination for providing an output current having characteristics indicating a binary input voltage having first characteristics representing a binary "1" and second characteristics representing a binary "0", a first MOS transistor, means for introducing a substantially constant reference voltage to the first MOS transistor, means for introducing the binary input voltage to the first MOS transistor to obtain a conductivity of the first MOS transistor for a particular one of the first and second characteristics in the binary input voltage and to obtain a non-conductivity of the first MOS transistor for the other one of the first and second characteristics in the binary input voltage, means including a second MOS transistor connected to the first MOS transistor and constructed to become non-conductive upon a state of conductivity in the first MOS transistor, means for introducing a substantially constant bias voltage to the second MOS transistor, means operatively coupled to the first and second MOS transistors and responsive to the substantially constant bias voltage introduced to the second MOS transistor for providing for a substantially constant flow of current through the second MOS transistor, and no flow of current through the first MOS transistor, during the state of conductivity in the second MOS transistor and for providing for the flow of the substantially constant current through the first MOS transistor, and no flow of current through the second MOS transistor, during the state of conductivity in the first MOS transistor to obtain the output current from the second MOS transistor in representation of the binary input voltage, there being distributed capacitances in the first MOS transistor, the distributed capacitances being charged during the state of non-conductivity in the first MOS transistor, the first and second MOS transistors being connected to provide for the control in the operation of the second MOS transistor in accordance with the state of operation in the first MOS transistor and the charge in the distributed capacitances in the first MOS transistor, the transistion from the state of non-conductivity to the state of conductivity in the second MOS transistor being expedited by the charging of the distributed capacitances when the first MOS transistor becomes non-conductive, means connected to the second MOS transistor to provide the output current through the second MOS transistor, the distributed capacitances in the first MOS transistor being operative to obtain a potential from the first MOS transistor upon a state of non-conductivity in the first MOS transistor for expediting the production of the substantially constant current through the second MOS transistor when the first MOS transistor becomes non-conductive and the distributed capacitances in the first MOS transistor being operative to discharge through the first MOS transistor when the first MOS transistor becomes conductive so as to expedite the time for the second MOS transistor to become non-conductive, the means for providing the substantially constant flow of current through the first and second MOS transistors during the respective conductivities of the first and second MOS transistors including a third MOS transistor and further including means for introducing a substantially constant bias voltage to the third MOS transistor to provide for the flow of the substantially constant current through the third MOS transistor, the first, second and third MOS transistors constituting p-type transistors, additional ones of the first MOS transistors, each being of the p-type, additional ones of the second MOS transistors, each being of the p-type, means for introducing the substantially constant reference voltage to each of the first additional MOS transistors, there being a plurality of binary input voltages each having first characteristics representing a binary "1" and second characteristics representing a binary "0", means for introducing each of the binary input voltages in the plurality to an individual one of the first additional MOS transistors to obtain a conductivity of such individual one of the first additional MOS transistors for the particular one of the first and second characteristics in such binary input voltage and to obtain a non-conductivity of such individual one of the first additional MOS transistors for the other one of the first and second characteristics in such binary input voltage, means including each of the second additional MOS transistors connected to an individual one of the first additional MOS transistors and constructed to become non-conductive upon a state of conductivity in such individual one of the first additional MOS transistors, means for introducing the substantially constant bias voltage to each of the second additional MOS transistors, means operatively coupled to each of the second additional MOS transistors and an individual one of the first additional MOS transistors and responsive to the substantially constant bias voltage for providing for a substantially constant flow of current through such second additional MOS transistor, and no flow of current through such individual one of the first additional MOS transistors, during the state of conductivity in such a second additional MOS transistor and for providing for the flow of the substantially constant current through such individual one of the first additional MOS transistors, and no flow of current through such second additional MOS transistor, during the state of conductivity in such individual one of the first additional MOS transistors to obtain the output current from such second additional MOS transistor in representation of the binary input voltage introduced to such individual one of the first additional MOS transistors, there being distributed capacitances in each of the first additional MOS transistors, the distributed capacitances in each individual one of the first additional MOS transistors being charged during the state of non-conductivity in such individual one of the first additional MOS transistors, each of the second additional MOS transistors and the individual one of the first additional MOS transistors being connected to provide for the control in the operation of such second additional MOS transistor in accordance with the state of operation in such individual one of the first additional MOS transistors and the charge in the distributed capacitances in such individual one of the first additional MOS transistors, the transition from the state of non-conductivity to the state of conductivity in each of the second additional MOS transistors being expedited by the charging of the distributed capacitances in the individual one of the first additional MOS transistors when such individual one of the first additional MOS transistors becomes non-conductive, the distributed capacitances in each individual one of the first additional MOS transistors being operative to obtain a potential from such individual one of the first additional MOS transistors upon a state of non-conductivity in such individual one of the first additional MOS transistors for expediting the production of the substantially constant current through the associated one of the second additional MOS transistors when such individual one of the first additional MOS transistors becomes non-conductive and the distributed capacitances in such individual one of the first additional MOS transistors being operative to discharge through such individual one of the first additional MOS transistors when such individual one of the first additional MOS transistors becomes conductive so as to expedite the time for the associated one of the second additional MOS transistors to become non-conductive, the means for providing the substantially constant flow of current through each of the second additional MOS transistors and the individual one of the first additional MOS transistors during the respective conductivities of such second additional MOS transistor and such individual one of the first MOS transistors including an individual one of third additional MOS transistors and further including means for introducing the substantially constant bias voltage to such individual one of the third additional MOS transistors to provide for the flow of the substantially constant current through such individual one of the third additional MOS transistors, the third additional MOS transistors constituting p-type transistors, and the means connected to the second MOS transistor to provide the output current constituting an output line, such output line also being connected directly to each of the second additional MOS transistors to provide in the output line an output current constituting an accumulation of the current through the second MOS transistor and the second additional MOS transistors.

22. In combination for providing an output current, there being a binary voltage having first characteristics representing a binary "1" and second characteristics representing a binary "0", a first MOS transistor, means for introducing a substantially constant reference voltage to the first MOS transistor, means for introducing the binary input voltage to the first MOS transistor to obtain a conductivity of the first MOS transistor for a particular one of the first and second characteristics and to obtain a non-conductivity of the first MOS transistor for the other one of the first and second characteristics, means including a second MOS transistor connected to the first MOS transistor and constructed to become non-conductive upon a state of conductivity in the first MOS transistor, means for introducing a substantially constant bias voltage to the second MOS transistor, means operatively coupled to the first and second MOS transistors and responsive to the substantially constant bias voltage introduced to the second MOS transistor for providing for a substantially constant flow of current through the second MOS transistor, and no flow of current through the first MOS transistor, during the state of conductivity in the second MOS transistor and for providing for the flow of the substantially constant current through the first MOS transistor, and no flow of current through the second MOS transistor, during the state of conductivity in the first MOS transistor to obtain the output current from the second MOS transistor in representation of the binary input voltage, there being distributed capacitances in the first MOS transistor, the distributed capacitances being charged during the state of non-conductivity in the first MOS transistor, the first and second MOS transistors being connected to provide for the control in the operation of the second MOS transistor in accordance with the state of operation in the first MOS transistor and the charge in the distributed capacitances, the transition from the state of non-conductivity to the state of conductivity in the second MOS transistor being expedited by the charging of the distributed capacitances when the first MOS transistor becomes non-conductive, means connected to the second MOS transistor to provide the output current through the second transistor, the distributed capacitances being operative to obtain a potential from the first MOS transistor upon a state of non-conductivity in the first MOS transistor for expediting the production of the substantially constant current through the second MOS transistor when the first MOS transistor becomes non-conductive and the distributed capacitances being operative to discharge through the first MOS transistor when the first MOS transistor becomes conductive so as to expedite the time for the second MOS transistor to become non-conductive, the means for providing the substantially constant flow of current through the first and second MOS transistors during the respective conductivities of the first and second MOS transistors including a third MOS transistor and further including means for introducing a substantially constant bias voltage to the third MOS transistor to provide for the flow of the substantially constant current through the third MOS transistor, the first, second and third MOS transistors constituting p-type transistors, additional ones of the first MOS transistors, additional ones of the second MOS transistors, the means for introducing the substantially constant reference voltage to the first transistor also introducing the substantially constant reference voltage to the first additional MOS transistors, there being a plurality of additional binary input voltages each having first characteristics representing a binary "1" and second characteristics representing a binary "0", means for introducing individual ones of the additional binary input voltages in the plurality to individual ones of the first additional MOS transistors to obtain a conductivity of the individual ones of the first additional MOS transistors for a particular one of the first and second characteristics in the individual ones of such additional binary input voltages and to obtain a non-conductivity of the individual ones of the first additonal MOS transistors for the other one of the first and second characteristics in the individual ones of such additional binary input voltages, each of the second additional MOS transistors being paired with an individual one of the first additional MOS transistors, means including each of the second additional MOS transistors connected to the individual one of the first additional MOS transistors and constructed to become non-conductive upon a state of conducitivity in the individual one of the first additional MOS transistors, the means for introducing the substantially constant bias voltage to the second MOS transistor also introducing the substantially constant bias voltage to the second additional MOS transistors, means operatively coupled to each of the second additional MOS transistors and the individual one of the first MOS transistors and responsive to the substantially constant bias voltage for providing for a substantially constant flow of current through such second additional MOS transistor, and no flow of current through such individual one of the first additional MOS transistors, during the state of conductivity in such second additional MOS transistor and for providing for the flow of the substantially constant current through such individual one of the first additional MOS transistors, and no flow of current through such second additional MOS transistor, during the state of conductivity in such individual one of the first additional MOS transistors to obtain the output current from such second additional MOS transistor in representation of the binary input voltage introduced to such individual one of the first additional MOS transistors, there being distributed capacitances in each of the first additional MOS transistors, the distributed capacitances in each of such first additional MOS transistor being charged during the state of non-conductivity in such first additional MOS transistor, each of the second additional MOS transistors and the individual one of the first additional MOS transistors being connected to provide for the control in the operation of such second additional MOS transistor in accordance with the state of operation in such individual one of the first additional MOS transistors and the charge in the distributed capacitances in such individual one of the first additional MOS transistor, the transition from the state of non-conductivity to the state of conductivity in each of the second additional MOS transistors being expedited by the charging of the distributed capacitances in such individual one of the first additional MOS transistors when such individual one of the first additional MOS transistors becomes non-conductive, the distributed capacitances in each individual one of the first additional MOS transistors being operative to obtain a potential from such individual one of the first additional MOS transistors upon a state of non-conductivity in such individual one of the first additional MOS transistors for expediting the production of the substantially constant current through the associated one of the second additional MOS transistors when such individual one of the first additional MOS transistors becomes non-conductive and the distributed capacitances in such individual one of the first additional MOS transistors being operative to discharge through such individual one of the first additional MOS transistors when such individual one of the first additional MOS transistors becomes conductive so as to expedite the time for the associated one of the second additional MOS transistors to become non-conductive, there being additional ones of the third MOS transistors, the means for providing the substantially constant flow of current through each of the second additional MOS transistors and the individual one of the first additional MOS transistors during the respective conductivities of such second additional MOS transistor and the individual one of the first additional MOS transistors including an individual one of the third additional MOS transistors, the means for introducing the substantially constant bias voltage to the third MOS transistor to provide for the flow of the substantially constant current through the third MOS transistor also being operative to introduce the substantially constant bias voltage to the third additional MOS transistors to provide for the flow of the substantially constant current through the third additional MOS transistors, each of the first, second and third additional MOS transistors constituting a p-type transistor, and the means connected to the second MOS transistor to provide the output current constituting an output line, such output line also being connected directly to the additional ones of the second additional MOS transistors to provide in the output line an output current constituting an accumulation of the current through the second MOS transistor and the second additional MOS transistors, servo means including a fourth MOS transistor operatively coupled to the third MOS transistor and the third additional MOS transistors and including a fifth MOS transistor operatively coupled to the second MOS transistor and the second additional MOS transistors for providing a closed loop path for regulating the flow of current through the first MOS transistor and the second MOS transistor and through the first and second additional MOS transistors to maintain the substantially constant current through the third MOS transistor and each of the third additional MOS transistors, the fourth and fifth MOS transistors being of the p-type.

23. A system for providing an output current, consisting of, there being a binary input voltage having first characteristics representing a binary "1" and second characteristics representing a binary "0", a first MOS transistor having first, second and third terminals, means for introducing the binary input voltage to the first terminal of the first MOS transistor, second and third MOS transistors connected in a series relationship, each of the second and third MOS transistors having first, second and third terminals, means for introducing a substantially constant voltage to the first terminal of the third MOS transistor to bias the third MOS transistor to a state of conductivity, means for introducing a substantially constant bias voltage to the first terminal of the second MOS transistor to provide for the flow of a substantially constant current continuously through the second MOS transistor, means for providing an activating voltage only of a single polarity, means for introducing the activating voltage to the third terminal of the second MOS transistor, means for providing a substantially constant reference potential to the second terminal of the first MOS transistor, means for commonly connecting the second terminal of the second MOS transistor, the third terminal of the first MOS transistor and the third terminal of the third MOS transistor to obtain the flow of the substantially constant current from the second MOS transistor through only one of the first and third MOS transistors dependent upon the characteristics of the voltage applied to the first terminal of the first MOS transistor, means for producing an output current at the second terminal of the third MOS transistor in accordance with the state of conductivity in the third MOS transistor, the first MOS transistor having distributed capacitances between the first and second terminals and the first and third terminals to expedite the response of the third MOS transistor to the binary input signal, each of the first, second and third MOS transistors being of the p-type, first additional MOS transistors corresponding to the first MOS transistor, second additional MOS transistors corresponding to the second MOS transistor, third additional MOS transistors corresponding to the third MOS transistor, there being a plurality of additional binary input voltages each having first characteristics representing a binary "1" and second characteristics representing a binary "0", means for introducing each of the additional binary input voltages to the first terminal of an individual one of the first additional MOS transistors, each of the additional ones of the first additional MOS transistors being associated with an individual one of the second additional MOS transistors and an individual one of the third additional MOS transistors, the individual ones of the second and third additional MOS transistors being connected in a series relationship, each of the first, second and third additional MOS transistors having first, second and third terminals, the means for introducing a substantially constant voltage to the first terminal of the third MOS transistor to bias the third MOS transistor to a state of conductivity also introducing the substantially constant bias voltage to the first terminal of each of the third additional MOS transistors, the means for introducing a substantially constant bias voltage to the first terminal of the second MOS transistor to provide for the flow of a substantially constant current continuously through the second MOS transistor also being introduced to the first terminal of each of the second additional MOS transistors to provide for the flow of the substantially constant current continuously through each such second additional MOS transistor, the means for introducing the activating voltage to the third terminal of the second MOS transistor also introducing the activating voltage to the third terminal of each of the second additional MOS transistors, the means for providing a substantially constant reference potential to the second terminal of the first MOS transistor also providing the substantially constant reference potential to the second terminal of each of the first additional MOS transistors, means for commonly connecting the second terminal of each individual one of the second additional MOS transistors, the third terminal of each associated one of the first addtional MOS transistors and the third terminal of each individual one of the third additional MOS transistors to obtain the flow of the substantially constant current from the individual one of the second additional MOS transistors through only the associated one of the first additional MOS transistors and the individual one of the third additional MOS transistors dependent upon the characteristics of the input voltage applied to the first terminal of the associated one of the first additional MOS transistors, each of the first, second and third additional MOS transistors being of the p-type, each of the first additional MOS transistors having distributed capacitances corresponding to the distributed capacitances in the first MOS transistor, and means including an output line directly connecting the second terminal of the third MOS transistor and the second terminals of the third additional MOS transistors to produce an accumulation on the output line of the output currents through the third MOS transistor and the third additional MOS transistors.

24. A system for providing an output current having characteristics indicating a binary input voltage having first characteristics representing a binary "1" and second characteristics representing a binary "0" and having a frequency of occurrence of at least fifty megahertz (50 Mhz), consisting of a first MOS transistor having first, second and third terminals, means for introducing the successive occurrences of the binary input voltage at the frequency of at least fifty megahertz (50 Mhz) to the first terminal of the first MOS transistor, second and third MOS transistors connected in a series relationship, each of the second and third MOS transistors having first, second and third terminals, means for introducing a substantially constant voltage to the first terminal of the third MOS transistor to bias the third MOS transistor to a state of conductivity, means for introducing a substantially constant bias voltage to the first terminal of the second MOS transistor to provide for the flow of a substantially constant current continuously through the second MOS transistor, means for providing an activating voltage only of a single polarity, means for introducing the activating voltage to the third terminal of the second MOS transistor, means for providing a substantially constant reference potential to the second terminal of the first MOS transistor, means for commonly connecting the second terminal of the second MOS transistor, the third terminal of the first MOS transistor and the third terminal of the third MOS transistor to obtain the flow of the substantially constant current from the second MOS transistor through only one of the first and third MOS transistors dependent upon the characteristics of the binary input voltage applied at the frequency of at least fifty megahertz (50 Mhz) to the first terminal of the first MOS transistor, and means for producing the output current at the second terminal of the third MOS transistor in accordance with the state of conductivity in the third MOS transistor, the first MOS transistor having distributed capacitances between the first and second terminals and the first and third terminals to expedite the response of the third MOS transistor to the binary input signal, each of the first, second and third transistors being of the same type.

25. A system as set forth in claim 23, consisting of, a fourth MOS transistor having first, second and third terminals, a fifth MOS transistor having first, second and third terminals, the fourth and fifth MOS transistors being of the p-type, the means for introducing the activating voltage to the third terminal of the second MOS transistor also introducing the activating voltage to the third terminal of the fourth MOS transistor, an operational amplifier having a pair of input terminals and an output terminal, the output terminal of the operational amplifier being connected to the first terminals of the second MOS transistor and the second additional MOS transistors, means for applying a substantially constant voltage to the first terminal of the operational amplifier and to the first terminal of the fifth MOS transistor, the second terminal of the fourth MOS transistor and the third terminal of the fifth MOS transistor having a common connection, means for providing a feedback from the second terminal of the fifth MOS transistor to the second input terminal of the operational amplifier to maintain the current through the fourth MOS transistor substantially constant, the first terminal of the fourth MOS transistor being connected to the first terminals of the second MOS transistor and the second additional MOS transistors, the first terminal of the fifth MOS transistor being connected to the first terminals of the third MOS transistor and the third additional MOS transistors.

26. A system for producing an output current, consisting of, there being a binary input voltage having first characteristics representative of a binary "1" and second characteristics representative of a binary "0", a first MOS transistor of the p-type, the first MOS transistor having states of conductivity and non-conductivity, the first MOS transistor having a source, a gate and a drain, there being distributed capacitances between the source and the gate of the first MOS transistor and between the gate and the drain of the first MOS transistor to facilitate the flow of current through the first MOS transistor when the first MOS transistor becomes conductive, means for introducing a substantially constant reference voltage to the drain of the first MOS transistor, means for introducing the binary input voltage to the gate of the first MOS transistor to obtain states of conductivity and non-conductivity in the first MOS transistor in accordance with the characteristics of such binary input voltage, a second MOS transistor of the p-type, the second MOS transistor having a source, a drain and a gate, the sources of the first and second MOS transistors being connected to each other, means for continuously introducing a substantially constant current to the sources of the first and second MOS transistors, means for introducing a substantially constant biasing voltage to the gate of the second MOS transistor, means for producing the output current at the drain of the second MOS transistor in accordance with the characteristics of the binary input voltage introduced to the gate of the first MOS transistor, the constant current means including a third MOS transistor biased to produce the flow of the substantially constant current continually through the third MOS transistor, the third MOS transistor being of the p-type, any voltage blips at the sources of the first and second MOS transistors being minimized by the distributed capacitances in the first MOS transistor, first additional MOS transistors corresponding to the first MOS transistor, second additional MOS transistors corresponding to the second MOS transistor, third additional MOS transistors corresponding to the third MOS transistor, there being a plurality of binary input voltages each having first characteristics representing a binary "1" and second characteristics representing a binary "0", means for introducing each individual one of the binary input voltages in the plurality to the gate of an individual one of the first additional MOS transistors, the sources of each of the first additional MOS transistors and of an individual one of the second additional MOS transistors being connected to each other, the means for continuously introducing a substantially constant current to the sources of the first and second MOS transistors also continuously introducing the substantially constant current to the sources of each of the first additional MOS transistors and the individual one of the second additional MOS transistors, the means for introducing a substantially constant biasing voltage to the gate of the second MOS transistor also introducing the substantially constant biasing voltage to the gate of each of the second additional MOS transistors, the constant current means including the first MOS transistor being biased to produce the flow of the substantially constant current continually through each of the third additional MOS transistors, there being distributed capacitances in each of the first additional MOS transistors corresponding to the distributed capacitances in the first MOS transistor, any voltage blips at the sources of each of the first additional MOS transistors and the individual one of the second additional MOS transistors being minimized by the distributed capacitances in such first additional MOS transistor, means including an output line for directly connecting the drain of the second MOS transistor and the drains of the second additional MOS transistors to produce a cumulative current in the output line in accordance with the characteristics of the individual ones of the binary input voltages introduced to the gates of the first MOS transistor and the first additional MOS transistors, the first, second and third additional MOS transistors being of the p-type.

27. A system as set forth in claim 26, consisting of:

any voltage blips on the sources of the first and second MOS transistors and the first and second additional MOS transistors and the drains of the third MOS transistor and the third additional MOS transistors being minimized by the distributed capacitances in the first MOS transistor and the first additional MOS transistors, the distributed capacitances in the first MOS transistor and the first additional MOS transistors being operative to decrease the time for the second MOS transistor and the second additional MOS transistors to become conductive when the first MOS transistor and the first additional MOS transistors become non-conductive, a fourth MOS transistor having a source, a gate and a drain and constituting a p-type, a fifth MOS transistor having a source, a gate and a drain and constituting a p-type, the gate of the fourth MOS transistor being connected to the gates of the third MOS transistor and the third additional MOS transistors, the gate of the fifth MOS transistor being connected to the gate of the second MOS transistor and the second additional MOS transistors, the drain of the fourth MOS transistor being connected to the source of the fifth MOS transistor, means for introducing an energizing voltage to the source of the fourth MOS transistor and the sources of the third MOS transistor and the source of the third additional MOS transistors, an operational amplifier having a pair of input terminals and an output terminal, means for introducing the voltage on the output terminal of the operational amplifier to the gate of the fourth MOS transistor to produce a flow of current through such MOS transistor, the means for introducing the substantially constant biasing voltage to the gate of the second MOS transistor also introducing the substantially constant biasing voltage to the first input terminal of the operational amplifier and the gate of the fifth MOS transistor, and means for feeding the voltage on the drain of the fifth MOS transistor back to the second input terminal of the operational amplifier for maintaining the flow of current through the fourth MOS transistor substantially constant.

28. In a combination as set forth in claim 22, each of the first, second and third MOS transistors and the first, second and third additional MOS transistors having a gate, a source and a drain, the substantially constant reference voltage being introduced to the drains of the first MOS transistor and the first additional MOS transistors, the binary input voltages, being introduced to the gates of the first MOS transistor and the first additional MOS transistors, the sources of the first and second MOS transistors and the drain of the third MOS transistor having a common connection, the source of each of the second additional MOS transistors and the source of the individual one of the first additional MOS transistors and the drain of the individual one of the third additional MOS transistors having a common connection, the substantially constant bias voltage being introduced to the gates of the second MOS transistor and the second additional MOS transistors, means for introducing an energizing voltage to the sources of the third MOS transistor and the third additional MOS transistors, the substantially constant bias voltage to provide for the flow of the substantially constant current through the third MOS transistor and the third additional MOS transistors being introduced to the gates of such MOS transistors, and the ouput line being connected directly to the drains of the second MOS transistor and the second additional MOS transistors, the distributed capacitance in the first MOS transistors and each of the first additional MOS transistors being between the source and the gate of each such transistor and between the gate and the drain of each such transistor.

29. In a combination as recited in claim 28, the fourth and fifth MOS transistors having a gate, a source and a drain, the substantially constant bias voltage being introduced to the gate of the fifth MOS transistor, an operational amplifier having first and second input terminals and having an output terminal connected to the gate of the fourth MOS transistor, the drain of the fourth MOS transistor and the source of the fifth MOS transistor having a common connection, the substantially constant bias voltage introduced to the gates of the second MOS transistor and the second additional MOS transistors also being introduced to the gate of the fifth MOS transistor and to the first input terminal of the operational amplifier, the drain of the fifth MOS transistor being connected to the second input terminal of the operational amplifier, and a resistance connected between the second input terminal of the operational amplifier and the reference voltage means.

30. A system for producing an output current representative of a binary input voltage having first characteristics representative of a binary "1" and second characteristics representative of a binary "0" and having a frequency of occurrence of at least fifty megahertz (50 Mhz), consisting of a first MOS transistor of the p-type, the first MOS transistor having states of conductivity and non-conductivity, the first MOS transistor having a source, a gate and a drain, there being distributed capacitances between the source and the gate of the first MOS transistor and between the gate and the drain of the first MOS transistor to facilitate the flow of current through the second MOS transistor when the second MOS transistor becomes conductive, means for introducing a substantially constant reference voltage to the drain of the first MOS transistor, means for introducing the successive occurrences of the binary input voltage at the frequency of at least fifty megahertz (50 Mhz) to the gate of the first MOS transistor to obtain states of conductivity and non-conductivity in the first MOS transistor in accordance with the logic level of such binary input voltage, a second MOS transistor of the p-type, the second MOS transistor having a source, a drain and a gate, the sources of the first and second MOS transistors being connected to each other, means for continuously introducing a substantially constant current to the sources of the first and second MOS transistors, means for introducing a substantially constant biasing voltage to the gate of the second MOS transistor, and means for producing the output current at the drain of the second MOS transistor in accordance with the logic levels of the successive occurrences of the input voltage introduced at the frequency of at least fifth megahertz (50 Mhz) to the gate of the first MOS transistor.

* * * * *